(12) United States Patent
Wadhwa et al.

(10) Patent No.: US 9,312,850 B2
(45) Date of Patent: Apr. 12, 2016

(54) TESTABLE POWER-ON-RESET CIRCUIT

(71) Applicants: Sanjay Kumar Wadhwa, Noida (IN);
Avinash Chandra Tripathi, Noida (IN)

(72) Inventors: Sanjay Kumar Wadhwa, Noida (IN);
Avinash Chandra Tripathi, Noida (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 136 days.

(21) Appl. No.: 14/463,668

(22) Filed: Aug. 20, 2014

(65) Prior Publication Data
US 2016/0056811 A1 Feb. 25, 2016

(51) Int. Cl.
*H03L 7/00* (2006.01)
*H03K 17/22* (2006.01)
*H03K 19/0185* (2006.01)
*H03K 3/037* (2006.01)

(52) U.S. Cl.
CPC ...... *H03K 17/223* (2013.01); *H03K 19/018521* (2013.01); *H03K 3/0375* (2013.01); *H03K 17/22* (2013.01)

(58) Field of Classification Search
None
See application file for complete search history.

(56) References Cited

U.S. PATENT DOCUMENTS

| 5,450,417 | A | | 9/1995 | Truong et al. | |
|---|---|---|---|---|---|
| 5,818,271 | A | * | 10/1998 | Stanojevic | H03K 17/22 323/315 |
| 6,111,441 | A | * | 8/2000 | Hartley | H03K 17/223 327/143 |
| 7,378,896 | B2 | * | 5/2008 | Wong | G06F 1/22 327/142 |
| 7,404,119 | B2 | | 7/2008 | Hsieh | |
| 7,519,486 | B2 | | 4/2009 | Ng et al. | |
| 7,710,105 | B2 | | 5/2010 | Chan et al. | |
| 8,228,100 | B2 | * | 7/2012 | Dao | G01R 19/16519 327/143 |
| 8,415,993 | B1 | * | 4/2013 | Newman | H03L 5/00 327/142 |
| 8,531,194 | B2 | | 9/2013 | Edwards | |
| 2008/0036510 | A1 | * | 2/2008 | Kim | H03K 17/223 327/143 |
| 2009/0267659 | A1 | * | 10/2009 | Li | H03K 17/22 327/143 |
| 2014/0285243 | A1 | * | 9/2014 | Nakamoto | H03K 17/223 327/143 |
| 2015/0326218 | A1 | * | 11/2015 | Byeon | H03K 19/018507 327/143 |

* cited by examiner

*Primary Examiner* — Tuan T Lam
(74) *Attorney, Agent, or Firm* — Charles E. Bergere

(57) ABSTRACT

An integrated circuit with a testable power-on-reset (POR) circuit includes a voltage divider, an inverter, a level-shifter, a buffer and a flip-flop. The voltage divider receives a first supply voltage and generates a second supply voltage. The POR circuit receives the second supply voltage and generates a POR voltage signal when the second supply voltage exceeds a POR de-assertion threshold. The level-shifter receives the POR voltage signal and an inverted POR voltage signal from the inverter circuit and generates a level-shifted POR voltage signal at a voltage level of the first supply voltage. The buffer receives the level-shifted POR voltage signal and outputs a delayed level-shifted POR voltage signal. The flip-flop receives the first supply voltage as data input, the delayed level-shifted POR voltage signal as clock input, the level-shifted POR voltage signal as reset input, and outputs a voltage-monitor signal at the voltage level of the first supply voltage.

20 Claims, 3 Drawing Sheets

TESTABLE POWER-ON-RESET CIRCUIT

BACKGROUND OF THE INVENTION

The present invention generally relates to integrated circuits, and, more particularly, to power-on-reset circuits.

Many integrated circuits (ICs) including system-on-chip (SoC) integrate various digital and analog components on a single chip. The components may include sequential elements such as flip-flops and combinational elements such as multiplexers and encoders. Such ICs are connected to external voltage sources for receiving supply voltages and the digital and analog components operate at a supply voltage level generated by the external voltage source. The IC is powered down by switching off the external voltage source, and when powered back on, the device is reset.

The IC is powered on by switching on the external voltage source. The supply voltage level received by the IC gradually ramps-up to the operating voltage level. However, during ramp-up, the supply voltage level is less than the operating voltage level for a short time, at which time the digital and analog components of the IC may malfunction and possibly damage the IC or set the IC in an indeterminate state. A power-on-reset (POR) circuit is provided to prevent these conditions.

The POR circuit receives the supply voltage from the external voltage source and generates a reset signal when the supply voltage level exceeds a threshold value. During power-up, when the supply voltage level is less than the threshold value, the POR circuit generates a logic low reset signal, which is provided to the digital and analog components and which places the digital and analog components in a known state (i.e., a reset state). Thus, the POR circuit sets the IC in a reset mode and ensures proper operation of the IC during power-up. When the supply voltage exceeds the threshold value, the POR circuit sets the reset signal high, de-asserting the reset state, which causes the IC to exit the reset state and begin operating. The threshold voltage level at which the POR circuit de-asserts the reset state is also referred to as a POR de-assertion threshold.

During the IC design stage, the POR de-assertion threshold is set at an optimum voltage level. If the POR de-assertion threshold exceeds the optimum voltage level, the IC remains in the reset mode, which delays the IC from being ready to function after power-up. Thus, the performance of the IC is negatively impacted. If the POR de-assertion threshold is less than the optimum voltage level, the digital and analog components may not be properly reset and thus may cause functional errors. Thus, it is essential that the POR de-assertion threshold be substantially equal to the optimum voltage level.

However, the POR de-assertion threshold can be affected by various factors such as process variations during fabrication, including within-die variations, lot-to-lot variations, die-to-die variations, wafer-to-wafer variations, etc. The POR circuit may also be sensitive to temperature, layout, and/or process parameters. Thus, to ensure high performance of the fabricated IC, it is essential to determine the POR de-assertion threshold during the testing and qualification stages.

Generally, a test IC is used to measure the POR de-assertion threshold. The POR circuit of the test IC is connected to an analog test pad and an external voltage source is used to provide a supply voltage to the test IC. The POR circuit provides the reset signal as an input to the analog test pad. As the supply voltage ramps-up, a transition voltage level of the supply voltage at which the reset signal transitions from low to high is measured. The transition voltage level is indicative of the POR de-assertion threshold of the POR circuit. This method of testing the POR circuit requires the addition of a dedicated analog test pad, which is undesirable due to the increased cost of adding the analog test pad.

Another technique of testing a POR circuit of a test IC includes connecting the output of the POR circuit to a test flip-flop. Before power-up, the test flip-flop is set to a known state. Then, as the supply voltage ramps-up, the output of the test flip-flop changes state at a transition voltage level of the supply voltage where the reset signal transitions from low to high. A processor core of the test IC polls the test flip-flop output to detect a change in its output. The processor core also monitors the supply voltage. Based on the transition, the processor core measures the POR de-assertion threshold of the POR circuit. However, the supply voltage required for the processor core to operate and poll the output of the test flip-flop exceeds the optimum voltage level of the POR circuit, so by the time the processor core can monitor the flip-flop, the POR de-assertion threshold has already been exceeded, so this method is not accurate.

A technique to overcome the aforementioned problems is to include a first set of input/output (IO) pads, a duplicate POR circuit and a driver circuit in the IC. The driver circuit is connected to the output of the duplicate POR circuit and to a test IO pad of the first set of IO pads. The driver circuit and the duplicate POR circuit receive a supply voltage. As the supply voltage ramps-up and exceeds the POR de-assertion threshold, the output of the duplicate POR circuit transitions from low to high. The driver circuit detects this transition at the output of the POR circuit and changes an impedance state of the test IO pad. A tester connected to the test IO pad detects the change in the impedance, and thereby determines the POR de-assertion threshold of the duplicate POR circuit. However, this method requires the first set of IO pads and the driver circuit, which increase the area overhead and power consumption of the IC.

It would be advantageous to have an IC with a testable power-on-reset (POR) circuit that prevents the IC from being set in an indeterminate state.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE PRESENT INVENTION

Figure 1:
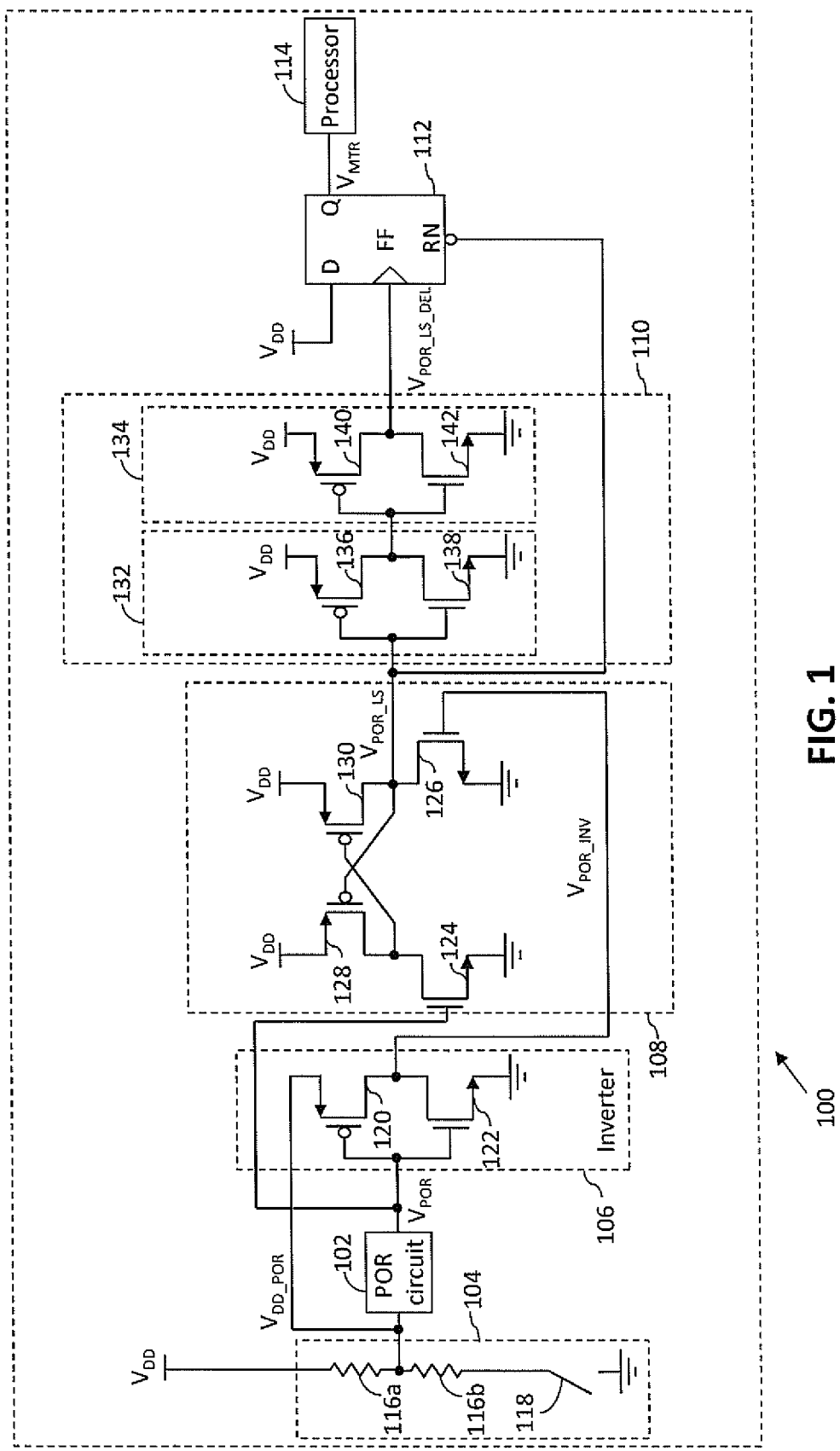
FIG. 1 is a schematic circuit diagram of an integrated circuit with a testable power-on-reset (POR) circuit in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, an integrated circuit with a testable power-on-reset (POR) circuit is provided. The integrated circuit includes a voltage divider, the POR circuit, an inverter, a level-shifter, a buffer, and a flip-flop. The voltage divider receives a first supply voltage and outputs a second supply voltage. The POR circuit is connected to the voltage divider for receiving the second supply voltage and generating a POR voltage signal when the second supply voltage exceeds a POR de-assertion threshold. The inverter is connected to the POR circuit for receiving the POR voltage signal and generating an inverted POR voltage signal. The level-shifter is connected to the POR circuit and the inverter for receiving the POR voltage signal and the inverted POR voltage signal, respectively, and generating a level-shifted POR voltage signal. The buffer is connected to the level-shifter for receiving the level-shifted POR voltage signal and providing a delayed level-shifted POR voltage signal. The flip-flop has a data input terminal connected to the first supply voltage, a clock input terminal connected to the buffer for receiving the delayed level-shifted POR voltage signal, a reset input terminal connected to the level-shifter for receiving the level-shifted POR voltage signal, and an output terminal for outputting a voltage-monitor signal.

In another embodiment of the present invention, an integrated circuit with a testable power-on-reset (POR) circuit is provided. The integrated circuit includes a voltage divider, the POR circuit, first through sixth transistors, a buffer, and a flip-flop. The voltage divider receives a first supply voltage and outputs a second supply voltage. The POR circuit is connected to the voltage divider for receiving the second supply voltage and generating a POR voltage signal when the second supply voltage exceeds a POR de-assertion threshold. The first transistor has a source terminal connected to the voltage divider for receiving the second supply voltage signal and a gate terminal connected to the POR circuit for receiving the POR voltage signal. The second transistor has a source terminal connected to ground, a gate terminal connected to the POR circuit for receiving the POR voltage signal, and a drain terminal connected to a drain terminal of the first transistor for generating an inverted POR voltage signal. The third transistor has a source terminal connected to ground and a gate terminal connected to the POR circuit for receiving the POR voltage signal. The fourth transistor has a source terminal connected to ground and a gate terminal connected to the drain terminal of the second transistor for receiving the inverted POR voltage signal. The fifth transistor has a source terminal connected to the first supply voltage, a gate terminal connected to a drain terminal of the fourth transistor, and a drain terminal connected to a drain terminal of the third transistor. The sixth transistor has a source terminal connected to the first supply voltage, a gate terminal connected to the drain terminal of the third transistor, and a drain terminal connected to the drain terminal of the fourth transistor for generating a level-shifted POR voltage signal. The buffer is connected to the drain terminal of the sixth transistor for receiving the level-shifted POR voltage signal and providing a delayed level-shifted POR voltage signal. The flip-flop has a data input terminal connected to the first supply voltage, a clock input terminal connected to the buffer for receiving the delayed level-shifted POR voltage signal, a reset input terminal connected to the drain terminal of the sixth transistor for receiving the level-shifted POR voltage signal, and an output terminal for outputting a voltage-monitor signal.

In yet another embodiment of the present invention, an integrated circuit with a testable power-on-reset (POR) circuit is provided. The integrated circuit includes a voltage divider, the POR circuit, an inverter, a level-shifter, a buffer, a flip-flop, and a processor. The voltage divider receives a first supply voltage and outputs a second supply voltage. The POR circuit is connected to the voltage divider for receiving the second supply voltage and generating a POR voltage signal when the second supply voltage exceeds a POR de-assertion threshold. The inverter is connected to the POR circuit for receiving the POR voltage signal and generating an inverted POR voltage signal. The level-shifter is connected to the POR circuit and the inverter for receiving the POR voltage signal and the inverted POR voltage signal, respectively, and generating a level-shifted POR voltage signal. The buffer is connected to the level-shifter for receiving the level-shifted POR voltage signal and providing a delayed level-shifted POR voltage signal. The flip-flop has a data input terminal for receiving the first supply voltage, a clock input terminal connected to the buffer for receiving the delayed level-shifted POR voltage signal, a reset input terminal connected to the level-shifter for receiving the level-shifted POR voltage signal, and an output terminal for outputting a voltage-monitor signal. The processor is connected to the output terminal of the flip-flop for receiving the voltage-monitor signal, determining a voltage level of the first supply voltage when the second supply voltage equals the POR de-assertion threshold, and determining the POR de-assertion threshold based on the voltage level of the first supply voltage.

Various embodiments of the present invention provide an integrated circuit with a testable power-on-reset (POR) circuit. The integrated circuit includes a voltage divider, the POR circuit, an inverter, a level-shifter, a buffer, a flip-flop, and a processor. The voltage divider receives a first supply voltage and outputs a second supply voltage. The POR circuit receives the second supply voltage from the voltage divider circuit and generates a POR voltage signal when the second supply voltage exceeds a POR de-assertion threshold. The inverter receives the POR voltage signal from the POR circuit and generates an inverted POR voltage signal. The level-shifter receives the POR voltage signal and the inverted POR voltage signal, and generates a level-shifted POR voltage signal. The buffer receives the level-shifted POR voltage signal and provides a delayed level-shifted POR voltage signal. The flip-flop receives the level-shifted POR voltage signal at a reset input terminal thereof and outputs a voltage-monitor signal at an output terminal thereof. Since the processor operates at the first supply voltage, the processor is operational and polls the output terminal of the flip-flop to determine a transition at the output of the flip-flop, thereby determining the POR de-assertion threshold. Since the integrated circuit does not include any additional IO pads and driver circuitry, the aforementioned technique reduces area overhead and power consumption of the integrated circuit.

Referring now to FIG. 1, a schematic circuit diagram of an integrated circuit (IC) 100 with a testable power-on-reset (POR) circuit 102 in accordance with an embodiment of the present invention is shown. The IC 100 includes the POR circuit 102, a voltage divider 104, an inverter 106, a level-shifter 108, a buffer 110, a flip-flop 112, and a processor 114.

The voltage divider 104 includes a first resistor 116a, a second resistor 116b, and a fuse 118. A first terminal of the first resistor 116a is connected to a first supply voltage ($V_{DD}$). In an embodiment of the present invention, the first supply voltage is generated by an external voltage regulator (not shown). The external voltage regulator is connected to a power management controller (PMC, not shown). In an example, the processor 114 sends a first set of control signals to the PMC to initiate an increase or decrease in the voltage level of the first supply voltage ($V_{DD}$). The PMC controls the external voltage regulator and adjusts the voltage level of the first supply voltage ($V_{DD}$) based on the first set of control signals. A second terminal of the first resistor 116a is connected to a first terminal of the second resistor 116b to form a voltage tap. A second terminal of the second resistor 116b is connected to ground by way of the fuse 118. The first and second resistors 116a and 116b have resistances $R_1$ and $R_2$, respectively. During normal operation of the IC 100, the fuse 118 is open and the voltage tap outputs a second supply voltage ($V_{DD\_POR}$) equal to the first supply voltage ($V_{DD}$). During testing of the POR circuit 102, the fuse 118 is closed and the voltage tap outputs the second supply voltage ($V_{DD\_POR}$) based on the following equation:

$$V_{DD\_POR}=V_{DD}*R_2/(R_1+R_2) \quad (1)$$

In an example, $R_1$=345.5 ohms, $R_2$=691 ohms, and the first supply voltage ($V_{DD}$)=1.05 V. Using equation (1), the second supply voltage ($V_{DD\_POR}$) is outputted at a voltage level of 0.7 V. In an embodiment of the present invention, low value resistances (as shown in the abovementioned example) are used to implement the resistances $R_1$ and $R_2$ to increase the amount of current flowing through the voltage divider 104 and to prevent the POR circuit 102 from loading the voltage divider 104.

The POR circuit 102 is connected to the voltage tap for receiving the second supply voltage ($V_{DD\_POR}$). The POR circuit 102 outputs a POR voltage signal ($V_{POR}$) at a logic high state when the second supply voltage ($V_{DD\_POR}$) exceeds a POR de-assertion threshold. The POR de-assertion threshold may vary from a designed POR de-assertion threshold due to various process variations, examples of which include but not limited to within-die variations, lot-to-lot variations, die-to-die variations, wafer-to-wafer variations, or individual defects, or the sensitivities of the POR circuit to temperature, layout, or process parameters.

The inverter 106 includes first and second transistors 120 and 122. The first transistor 120 has a source terminal connected to the voltage tap for receiving the second supply voltage ($V_{DD\_POR}$) and a gate terminal connected to POR circuit 102 for receiving the POR voltage signal ($V_{POR}$). The second transistor 122 has a source terminal connected to ground, a gate terminal connected to the POR circuit 102 for receiving the POR voltage signal ($V_{POR}$), and a drain terminal connected to a drain terminal of the first transistor 120 for outputting an inverted POR voltage signal ($V_{POR\_INV}$).

The level-shifter 108 includes third through sixth transistors 124-130. The third transistor 124 has a source terminal connected to ground and a gate terminal connected to the POR circuit 102 for receiving the POR voltage signal ($V_{POR}$). The fourth transistor 126 has a source terminal connected to ground and a gate terminal connected to the drain terminal of the first transistor 120 for receiving the inverted POR voltage signal ($V_{POR\_INV}$). The fifth transistor 128 has a source terminal connected to the first supply voltage ($V_{DD}$), a gate terminal connected to a drain terminal of the fourth transistor 126, and a drain terminal connected to a drain terminal of the third transistor 124. The sixth transistor 130 has a source terminal connected to the first supply voltage ($V_{DD}$), a gate terminal connected to the drain terminal of the fifth transistor 128, and a drain terminal connected to the drain terminal of the fourth transistor 126 for outputting a level-shifted POR voltage signal ($V_{POR\_LS}$).

The buffer 110 includes first and second inverters 132 and 134. The first inverter 132 includes seventh and eighth transistors 136 and 138. The seventh transistor 136 has a source terminal connected to the first supply voltage ($V_{DD}$) and a gate terminal connected to the drain terminal of the sixth transistor 130 for receiving the level-shifted POR voltage signal ($V_{POR\_LS}$). The eighth transistor 138 has a source terminal connected to ground, a gate terminal connected to the drain terminal of the sixth transistor 130 for receiving the level-shifted POR voltage signal ($V_{POR\_LS}$), and a drain terminal connected to a drain terminal of the seventh transistor 136 for outputting an inverted level-shifted POR voltage signal. The second inverter 134 includes ninth and tenth transistors 140 and 142. The ninth transistor 140 has a source terminal connected to the first supply voltage ($V_{DD}$) and a gate terminal connected to the drain terminal of the eighth transistor 138 for receiving the inverted level-shifted POR voltage signal. The tenth transistor 142 has a source terminal connected to ground, a gate terminal connected to the gate terminal of the ninth transistor 140, and a drain terminal connected to a drain terminal of the ninth transistor 140 for outputting a delayed level-shifted POR voltage signal ($V_{POR\_LS\_DEL}$).

The flip-flop 112 has a data input terminal connected to the first supply voltage ($V_{DD}$), a clock input terminal connected to the drain terminal of the tenth transistor 142 for receiving the delayed level-shifted POR voltage signal ($V_{POR\_LS\_DEL}$), a reset input terminal connected to the drain terminal of the sixth transistor 130 for receiving the level-shifted POR voltage signal ($V_{POR\_LS}$), and an output terminal for outputting a voltage-monitor signal ($V_{MTR}$). The flip-flop 112 is in a reset state when the level-shifted POR voltage signal ($V_{POR\_LS}$) is at a logic low state. The flip-flop 112 outputs the voltage-monitor signal ($V_{MTR}$) at a voltage level of the first supply voltage ($V_{DD}$) indicative of a logic high state when the level-shifted POR voltage signal ($V_{POR\_LS}$) transitions from logic low state to logic high state.

The processor 114 is connected to the output terminal of the flip-flop 112 for receiving the voltage-monitor signal ($V_{MTR}$). The processor 114 operates at the voltage level of the first supply voltage ($V_{DD}$). The processor 114 polls the output terminal of the flip-flop 112 and determines a transition in the logic state of the voltage-monitor signal ($V_{MTR}$). The processor 114 also monitors the voltage level of the first supply voltage ($V_{DD}$). The voltage-monitor signal ($V_{MTR}$) transitions from a logic low state to a logic high state when the second supply voltage ($V_{DD\_POR}$) equals the POR de-assertion threshold, thereby allowing the processor 114 to determine a first transition voltage level of the first supply voltage ($V_{DD}$) when the second supply voltage ($V_{DD\_POR}$) is substantially equal to the POR de-assertion threshold. The processor 114 uses equation (1) to determine a second transition voltage level of the second supply voltage ($V_{DD\_POR}$). The second transition voltage level of the second supply voltage ($V_{DD\_POR}$) is substantially equal to the POR de-assertion threshold of the POR circuit 102.

Figure 2:
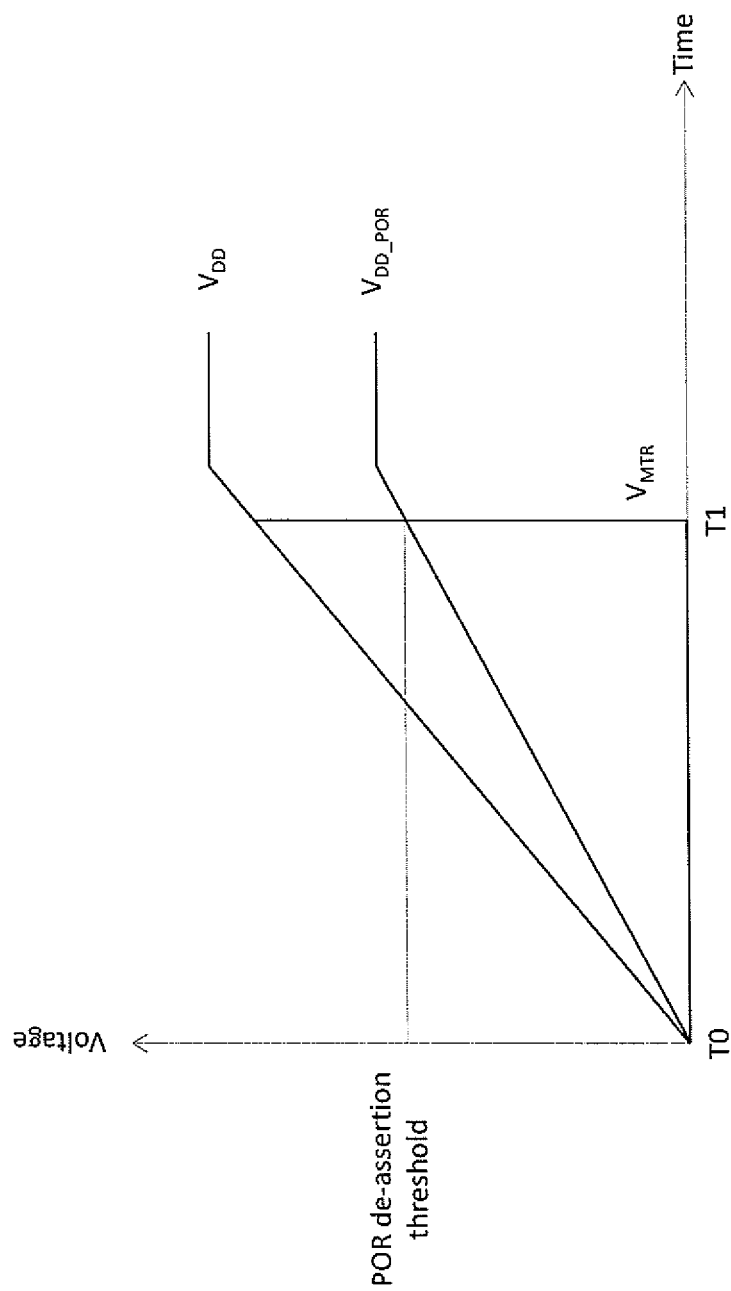
FIG. 2 is a timing diagram illustrating various voltage signals of the integrated circuit of FIG. 1.

Referring now to FIG. 2, a timing diagram illustrating the first supply voltage ($V_{DD}$), the second supply voltage ($V_{DD\_POR}$), and the voltage-monitor signal ($V_{MTR}$) of the IC 100 is shown.

In operation, at time instance T0, the fuse 118 is closed to initiate testing of the POR circuit 102. The second supply voltage ($V_{DD\_POR}$) is generated at the voltage tap. As the first supply voltage ($V_{DD}$) ramps-up, the second supply voltage ($V_{DD\_POR}$) also ramps-up. During the time period T0-T1, the second supply voltage ($V_{DD\_POR}$) is less than the POR de-assertion threshold. The POR circuit 102 generates the POR voltage signal ($V_{POR}$) at a logic low state. The inverter 106 generates the inverted POR voltage signal ($V_{POR\_INV}$) at a logic high state. The level-shifter 108 receives the logic low POR voltage signal ($V_{POR}$) and the logic high inverted POR voltage signal ($V_{POR\_INV}$) and outputs the level-shifted POR voltage signal ($V_{POR\_LS}$) at a logic low state. The buffer 110 outputs the delayed level-shifted POR voltage signal ($V_{POR\_LS\_DEL}$) at a logic low state. Since the flip-flop 112 receives the logic low level-shifted POR voltage signal ($V_{POR\_LS}$) at the reset input terminal thereof, the flip-flop 112 is at a reset state and outputs the voltage-monitor signal ($V_{MTR}$) at a logic low state. Thus, the logic state of the voltage-monitor signal ($V_{MTR}$) does not transition during time period T0-T1. The processor 114 does not detect any transition at the output terminal of the flip-flop 112.

At time instance T1, the second supply voltage ($V_{DD\_POR}$) exceeds the POR de-assertion threshold. The POR circuit 102 generates the POR voltage signal ($V_{POR}$) at a logic high state. The inverter 106 generates the inverted POR voltage signal ($V_{POR\_INV}$) at a logic low state. The level-shifter 108 receives the logic high POR voltage signal ($V_{POR}$) and the logic low inverted POR voltage signal ($V_{POR\_INV}$) and outputs the level-shifted POR voltage signal ($V_{POR\_LS}$) at a voltage level of the first supply voltage ($V_{DD}$) indicative of a logic high state. The buffer 110 outputs the delayed level-shifted POR voltage signal ($V_{POR\_LS\_DEL}$) at a logic high state. Since the flip-flop 112 receives the logic high level-shifted POR voltage signal ($V_{POR\_LS}$) at the reset input terminal thereof, the flip-flop 112 exits the reset state. Further, the flip-flop 112 receives the logic high delayed level-shifted POR voltage signal ($V_{POR\_LS}$) at the clock input terminal thereof and outputs the voltage-monitor signal ($V_{MTR}$) at a voltage level of the first supply voltage ($V_{DD}$) indicative of a logic high state. Thus, at time instance T1, the voltage-monitor signal ($V_{MTR}$) transitions from logic low state to a logic high state. The processor 114 detects the transition at the output terminal of the flip-flop 112 and determines the first transition voltage level of the first supply voltage ($V_{DD}$). The processor 114 then determines the second transition voltage level of the second supply voltage ($V_{DD\_POR}$) that is substantially equal to the POR de-assertion threshold. Thus, the processor 114 accurately determines the POR de-assertion threshold of the POR circuit 102. Since the IC 100 does not include any additional IO pads and driver circuitry, the aforementioned technique reduces area overhead and power consumption of the IC 100.

Figure 3:
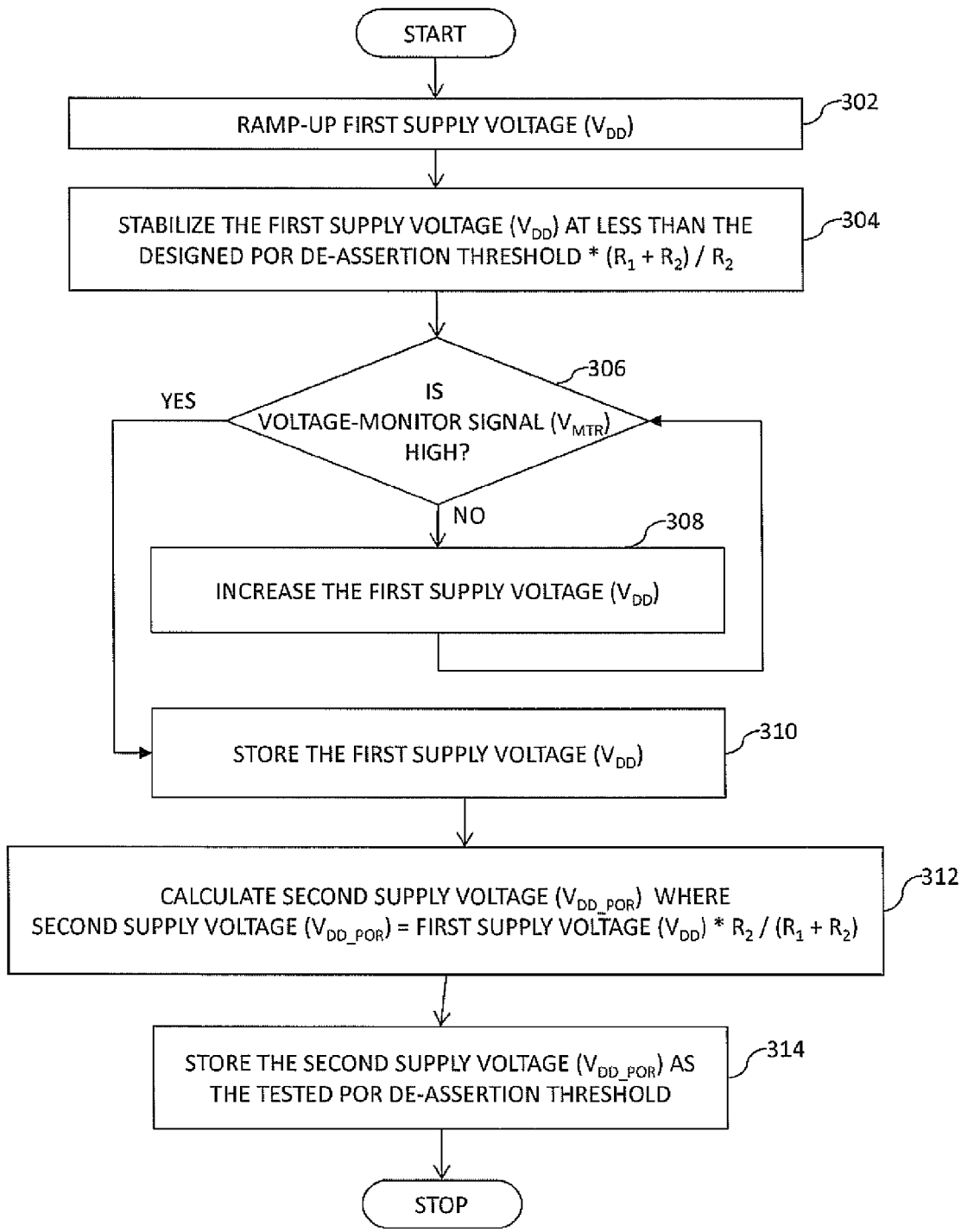
FIG. 3 is a flow chart illustrating a method of determining the POR de-assertion threshold of an IC in accordance with an embodiment of the present invention.

Referring now to FIG. 3, a flow chart illustrating a method of determining the POR de-assertion threshold in accordance with an embodiment of the present invention is shown. At step 302, the first supply voltage ($V_{DD}$) starts ramping up. At step 304, the first supply voltage ($V_{DD}$) is stabilized at a voltage level less than the designed POR de-assertion threshold*($R_1 + R_2$)/$R_2$. In an example, the processor 114 generates and transmits a first set of control signals to the PMC to stabilize the first supply voltage ($V_{DD}$). The PMC controls the external voltage regulator to adjust the first supply voltage ($V_{DD}$). In another example, a tester (not shown), external to the IC 100, adjusts the first supply voltage ($V_{DD}$) to stabilize the first supply voltage ($V_{DD}$). At step 306, the processor 114 polls the output terminal of the flip-flop 112 and determines a transition in the logic state of the voltage-monitor signal ($V_{MTR}$). The processor 114 checks to determine the logic state of the voltage-monitor signal ($V_{MTR}$). If at step 306, the processor 114 determines that the voltage-monitor signal ($V_{MTR}$) is at a logic low state, step 308 is executed. At step 308, the processor 114 generates and transmits the first set of control signals to the PMC to increase the first supply voltage ($V_{DD}$) by a pre-determined voltage level. The PMC controls the external voltage regulator to increase the first supply voltage ($V_{DD}$) by the pre-determined voltage level.

However, if at step 306, the processor 114 determines that the voltage-monitor signal ($V_{MTR}$) is at a logic high state, step 310 is executed. At step 310, the processor 114 stores the first supply voltage ($V_{DD}$). At step 312, the processor 114 calculates the second supply voltage ($V_{DD\_POR}$) using the equation (1). At step 314, the processor 114 stores the second supply voltage ($V_{DD\_POR}$) as the tested POR de-assertion threshold. The second supply voltage ($V_{DD\_POR}$) is substantially equal to the POR de-assertion threshold of the POR circuit 102.

In an embodiment of the present invention, the first, fifth, sixth, seventh and ninth transistors 120, 128, 130, 136, and 140 are p-channel metal oxide semiconductor (PMOS) transistors, and the second, third, fourth, eighth and tenth transistors 122, 124, 126, 138, and 142 are n-channel metal oxide semiconductor (NMOS) transistors.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. An integrated circuit, comprising:
   a voltage divider for receiving a first supply voltage and outputting a second supply voltage;
   a power-on-reset (POR) circuit connected to the voltage divider for receiving the second supply voltage and generating a POR voltage signal when the second supply voltage exceeds a POR de-assertion threshold;
   an inverter connected to the POR circuit for receiving the POR voltage signal and generating an inverted POR voltage signal;
   a level-shifter connected to the POR circuit and the inverter for receiving the POR voltage signal and the inverted POR voltage signal, respectively, and generating a level-shifted POR voltage signal;
   a buffer connected to the level-shifter for receiving the level-shifted POR voltage signal and providing a delayed level-shifted POR voltage signal; and
   a flip-flop having a data input terminal for receiving the first supply voltage, a clock input terminal connected to the buffer for receiving the delayed level-shifted POR voltage signal, a reset input terminal connected to the level-shifter for receiving the level-shifted POR voltage signal, and an output terminal for outputting a voltage-monitor signal.

2. The integrated circuit of claim 1, further comprising a processor connected to the output terminal of the flip-flop for receiving the voltage-monitor signal and determining a voltage level of the first supply voltage when the second supply voltage equals the POR de-assertion threshold, and wherein the processor further determines the POR de-assertion threshold based on the voltage level of the first supply voltage.

3. The integrated circuit of claim 2, wherein the level-shifted POR voltage signal is generated at the voltage level of the first supply voltage.

4. The integrated circuit of claim 1, wherein the voltage divider includes a resistor-ladder circuit having a voltage tap, wherein the second supply voltage is output at the voltage tap.

5. The integrated circuit of claim 4, wherein the inverter comprises:
   a first transistor having a source terminal connected to the voltage tap of the resistor-ladder circuit for receiving the second supply voltage and a gate terminal connected to the POR circuit for receiving the POR voltage signal; and
   a second transistor having a source terminal connected to ground, a gate terminal connected to the POR circuit for receiving the POR voltage signal, and a drain terminal connected to a drain terminal of the first transistor for outputting the inverted POR voltage signal.

6. The integrated circuit of claim 1, wherein the level-shifter comprises:
   a first transistor having a source terminal connected to ground and a gate terminal connected to the POR circuit for receiving the POR voltage signal;
   a second transistor having a source terminal connected to ground and a gate terminal connected to the inverter for receiving the inverted POR voltage signal;
   a third transistor having a source terminal connected to the first supply voltage, a gate terminal connected to a drain terminal of the second transistor, and a drain terminal connected to a drain terminal of the first transistor; and
   a fourth transistor having a source terminal connected to the first supply voltage, a gate terminal connected to the drain terminal of the third transistor, and a drain terminal connected to the drain terminal of the second transistor for outputting the level-shifted POR voltage signal.

7. The integrated circuit of claim 1, wherein the buffer comprises:
   a first inverter connected to the level-shifter for receiving the level-shifted POR voltage signal and generating an inverted level-shifted POR voltage signal; and
   a second inverter connected to the first inverter for receiving the inverted level-shifted POR voltage signal and generating the delayed level-shifted POR voltage signal.

8. The integrated circuit of claim 7, wherein the first inverter comprises:
   a first transistor having a source terminal connected to the first supply voltage and a gate terminal connected to the level-shifter for receiving the level-shifted POR voltage signal; and
   a second transistor having a source terminal connected to ground, a gate terminal connected to the level-shifter for receiving the level-shifted POR voltage signal and a drain terminal connected to a drain terminal of the first transistor for outputting the inverted level-shifted POR voltage signal.

9. The integrated circuit of claim 8, wherein the second inverter comprises:
   a third transistor having a source terminal connected to the first supply voltage and a gate terminal connected to the drain terminal of the first transistor for receiving the inverted level-shifted POR voltage signal; and
   a fourth transistor having a source terminal connected to ground, a gate terminal connected to the drain terminal of the first transistor for receiving the inverted level-shifted POR voltage signal, and a drain terminal connected to a drain terminal of the third transistor for outputting the delayed level-shifted POR voltage signal.

10. An integrated circuit, comprising:
    a voltage divider for receiving a first supply voltage and outputting a second supply voltage;
    a power-on-reset (POR) circuit connected to the voltage divider for receiving the second supply voltage and generating a POR voltage signal when the second supply voltage exceeds a POR de-assertion threshold;
    a first transistor having a source terminal connected to the voltage divider for receiving the second supply voltage and a gate terminal connected to the POR circuit for receiving the POR voltage signal;
    a second transistor having a source terminal connected to ground, a gate terminal connected to the POR circuit for receiving the POR voltage signal, and a drain terminal connected to a drain terminal of the first transistor for generating an inverted POR voltage signal;
    a third transistor having a source terminal connected to ground and a gate terminal connected to the POR circuit for receiving the POR voltage signal;
    a fourth transistor having a source terminal connected to ground and a gate terminal connected to the drain terminal of the second transistor for receiving the inverted POR voltage signal;
    a fifth transistor having a source terminal connected to the first supply voltage, a gate terminal connected to a drain terminal of the fourth transistor, and a drain terminal connected to a drain terminal of the third transistor;
    a sixth transistor having a source terminal connected to the first supply voltage, a gate terminal connected to the drain terminal of the third transistor, and a drain terminal connected to the drain terminal of the fourth transistor for generating a level-shifted POR voltage signal;
    a buffer connected to the drain terminal of the sixth transistor for receiving the level-shifted POR voltage signal and providing a delayed level-shifted POR voltage signal; and
    a flip-flop having a data input terminal connected to the first supply voltage, a clock input terminal connected to the buffer for receiving the delayed level-shifted POR voltage signal, a reset input terminal connected to the drain terminal of the sixth transistor for receiving the level-shifted POR voltage signal, and an output terminal for outputting a voltage-monitor signal.

11. The integrated circuit of claim 10, further comprising a processor connected to the output terminal of the flip-flop for receiving the voltage-monitor signal and determining a voltage level of the first supply voltage when the second supply voltage equals the POR de-assertion threshold, and wherein the processor further determines the POR de-assertion threshold based on the voltage level of the first supply voltage.

12. The integrated circuit of claim 11, wherein the level-shifted POR voltage signal is generated at the voltage level of the first supply voltage.

13. The integrated circuit of claim 10, wherein the voltage divider includes a resistor-ladder circuit having a voltage tap, wherein the second supply voltage is outputted at the voltage tap.

14. The integrated circuit of claim 10, wherein the buffer comprises:
    a first inverter connected to the drain terminal of the sixth transistor for receiving the level-shifted POR voltage signal and generating an inverted level-shifted POR voltage signal; and
    a second inverter connected to the first inverter for receiving the inverted level-shifted POR voltage signal and generating the delayed level-shifted POR voltage signal.

15. The integrated circuit of claim 14, wherein the first inverter comprises:
    a seventh transistor having a source terminal connected to the first supply voltage and a gate terminal connected to the drain terminal of the sixth transistor for receiving the level-shifted POR voltage signal; and
    an eighth transistor having a source terminal connected to ground, a gate terminal connected to the drain terminal of the sixth transistor for receiving the level-shifted POR voltage signal, and a drain terminal connected to a drain terminal of the seventh transistor for outputting the inverted level-shifted POR voltage signal.

16. The integrated circuit of claim 15, wherein the second inverter comprises:
    a ninth transistor having a source terminal connected to the first supply voltage and a gate terminal connected to the drain terminal of the seventh transistor for receiving the inverted level-shifted POR voltage signal; and a tenth transistor having a source terminal connected to ground, a gate terminal connected to the drain terminal of the seventh transistor for receiving the inverted level-shifted POR voltage signal, and a drain terminal connected to a drain terminal of the ninth transistor for outputting the delayed level-shifted POR voltage signal.

17. The integrated circuit of claim 16, wherein the first, fifth, sixth, seventh and ninth transistors are p-channel metal oxide semiconductor (PMOS) transistors, and wherein the second, third, fourth, eighth and tenth transistors are n-channel metal oxide semiconductor (NMOS) transistors.

18. An integrated circuit, comprising:
a voltage divider for receiving a first supply voltage and outputting a second supply voltage;
a power-on-reset (POR) circuit connected to the voltage divider for receiving the second supply voltage and generating a POR voltage signal when the second supply voltage exceeds a POR de-assertion threshold;
an inverter connected to the POR circuit for receiving the POR voltage signal and generating an inverted POR voltage signal;
a level-shifter connected to the POR circuit and the inverter for receiving the POR voltage signal and the inverted POR voltage signal, respectively, and generating a level-shifted POR voltage signal;
a buffer connected to the level-shifter for receiving the level-shifted POR voltage signal and providing a delayed level-shifted POR voltage signal;
a flip-flop having a data input terminal for receiving the first supply voltage, a clock input terminal connected to the buffer for receiving the delayed level-shifted POR voltage signal, a reset input terminal connected to the level-shifter for receiving the level-shifted POR voltage signal, and an output terminal for outputting a voltage-monitor signal; and
a processor, connected to the output terminal of the flip-flop for receiving the voltage-monitor signal, determining a voltage level of the first supply voltage when the second supply voltage equals the POR de-assertion threshold, and determining the POR de-assertion threshold based on the voltage level of the first supply voltage.

19. The integrated circuit of claim 18, wherein the level-shifter comprises:
a first transistor having a source terminal connected to ground and a gate terminal connected to the POR circuit for receiving the POR voltage signal;
a second transistor having a source terminal connected to ground and a gate terminal connected to the inverter for receiving the inverted POR voltage signal;
a third transistor having a source terminal connected to the first supply voltage, a gate terminal connected to a drain terminal of the second transistor, and a drain terminal connected to a drain terminal of the first transistor; and
a fourth transistor having a source terminal connected to the first supply voltage, a gate terminal connected to the drain terminal of the third transistor, and a drain terminal connected to the drain terminal of the second transistor for outputting the level-shifted POR voltage signal.

20. The integrated circuit of claim 18, wherein the buffer comprises:
a first transistor having a source terminal connected to the first supply voltage and a gate terminal connected to the level-shifter for receiving the level-shifted POR voltage signal;
a second transistor having a source terminal connected to ground, a gate terminal connected to the level-shifter for receiving the level-shifted POR voltage signal and a drain terminal connected to a drain terminal of the first transistor for outputting the inverted level-shifted POR voltage signal;
a third transistor having a source terminal connected to the first supply voltage and a gate terminal connected to the drain terminal of the first transistor for receiving the inverted level-shifted POR voltage signal; and
a fourth transistor having a source terminal connected to ground, a gate terminal connected to the drain terminal of the first transistor for receiving the inverted level-shifted POR voltage signal, and a drain terminal connected to a drain terminal of the third transistor for outputting the delayed level-shifted POR voltage signal.

* * * * *